United States Patent [19]

Yasumoto et al.

[11] Patent Number: 4,941,072
[45] Date of Patent: Jul. 10, 1990

[54] LINEAR LIGHT SOURCE

[75] Inventors: Masami Yasumoto; Tatsuya Motoike; Toshiyuki Sawasa, all of Tottori, Japan

[73] Assignees: Sanyo Electric Co., Ltd., Osaka; Tottori Sanyo Electric Co., Ltd., Tottori, both of Japan

[21] Appl. No.: 335,188

[22] Filed: Apr. 7, 1989

[30] Foreign Application Priority Data

Apr. 8, 1988 [JP] Japan .................................. 63-87911
Jul. 27, 1988 [JP] Japan ................................. 63-187731

[51] Int. Cl.$^5$ .......................... F21V 21/00; F21V 5/04
[52] U.S. Cl. .................................. 362/249; 362/335; 362/800; 355/70
[58] Field of Search ............... 362/800, 802, 235, 335, 362/276, 249, 244, 245, 340, 347; 355/70, 228, 229

[56] References Cited

U.S. PATENT DOCUMENTS

| | | | |
|---|---|---|---|
| 4,255,042 | 5/1981 | Armitage, Jr. et al. | 362/800 X |
| 4,343,032 | 8/1982 | Schwartz | 362/276 |
| 4,398,240 | 8/1983 | Savage, Jr. | 362/800 X |
| 4,630,180 | 12/1986 | Muraki et al. | 362/800 X |
| 4,631,675 | 12/1986 | Jacobsen et al. | 362/802 X |
| 4,733,335 | 3/1988 | Serizawa et al. | 362/800 X |
| 4,839,777 | 6/1989 | Jarks et al. | 362/800 X |

FOREIGN PATENT DOCUMENTS 147177 8/1985 Japan .

Primary Examiner—Ira S. Lazarus
Assistant Examiner—Peggy A. Neils
Attorney, Agent, or Firm—Darby & Darby

[57] ABSTRACT

According to the present invention, a resin molded product provided with engaging projections to be engaged with engaging members, which have been previously formed in side walls of a frame member, and wing members to be in contact with top portions of the side walls of the frame member alternately formed on the side walls thereof is used as a rod lens of the linear light source. Thus, a curvature of the rod lens can be optionally selected and the linear light source is superior also in assembling. In addition, in the case where this rod lens is composed of a lens surface covering a width of opening of the frame member and an almost flat counter surface positioned opposite to this lens surface, a light-scattering effect is brought about in the counter surface of the rod lens by taking a refractive index or a thickness of this rod lens into consideration, whereby a width of illumination can be increased.

19 Claims, 6 Drawing Sheets

LINEAR LIGHT SOURCE

BACKGROUND OF THE INVENTION

1. Field of the Invention

The present invention relates to a linear light source using a light emitting diode.

2. Description of the Prior Art

Recently, a light emitting diode has been used in a linear light source for use in the illumination of documents and the like. Such the linear light source comprises a long substrate (plate such as print-circuit-board), light emitting diodes arranged in a line on the substrate and a rod lens supported above the light emitting diodes. Such a rod lens, which has been most widely used, is a columnar lens made of glass, as disclosed in Japanese Patent Application Laid-Open No. 58-225673 (1983), Japanese Patent Application Laid-Open No. 60-129714 (1985) and the like. The columnar lens made of glass is used because it is strong in spite of its increased length, a distance between the lens and the light emitting diodes being able to be easily maintained constant, the transparency being able to be maintained at a high value, and the like.

However, in the case where the columnar lens made of glass is used as the rod lens, problems have occurred in that it is made of glass and columnar.

At first, as to the matter that it is made of glass, the rod lens made of glass shows a problem in that a width of illumination and an intensity of illumination on a surface of illumination are difficult to regulate. That is to say, a distance from the lens to the surface of illumination, such as document, it defined and then a diameter of the rod lens and a distance between the rod lens and the light emitting diodes are defined so that an appointed width of illumination of about 0.5 to 1.2 mm may be obtained. But if the width of illumination is increased, the intensity of illumination is reduced. In general, in order to make the installation of the linear light source and reading elements easy, it is required that the width of illumination be as large as possible to an extent of 1.0 to 5.0 mm. Accordingly, the intensity of illumination is reduced to nearly the permissible limit and the diameter of the rod lens made of glass, the height of a frame member for supporting the rod lens and the like must be redesigned every time when the specifications are slightly changed, so that the productivity has been inferior.

So, it was investigated to mold the rod lens from resin capable of relatively freely changing a curvature of the lens. However, the rod lens has a diameter (or thickness) of at most 10 mm and a length of 80 to 500 mm, that is it is slender, and it can not have any intermediate joints, so that the rod lens made of resin is apt to form surface patterns resulting from traces of the flow of resin during the molding and dislocation boundaries, which lead to an uneven illumination and are undesirable. In addition, if the conditions go still more worse, bubbles are formed in the lens and the transparency is reduced because of the rough surface, cloudiness and the like, whereby the desired optical characteristics can not be obtained, which have been disadvantageous. Furthermore, even if the rod lens has not taken such a disadvantage, the substrate and the frame member are apt to extend and contract on account of the temperature rise of light emitting diodes when they are turned on. A slender resin lens is not capable of correcting such an extension and contraction. The rod lens bends into or out of its frame member making it difficult to maintain its optical positional relation relative to the surface of illumination constant.

Figure 1:
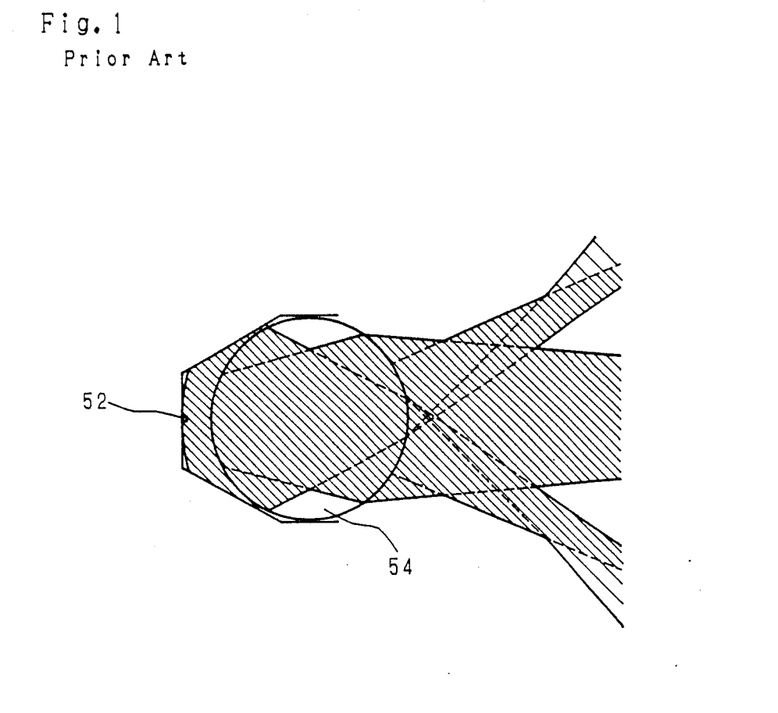
FIG. 1 is a diagram showing a beam from the conventional linear light source using a columnar rod lens.

On the other hand, the columnar lens can maintain a suitable strength and the desired optical characteristics even though its length is increased. As shown in Prior Art FIG. 1, a central portion of the columnar lens 54 serves as a so-called collecting lens, the optical path is complex, and a relatively large quantity of light irradiating places other than the surface of illumination, as shown by oblique lines in FIG. 1. This means that 1 it is difficult to design the size of the diameter of the columnar lens and the position of its center for carrying out the illumination of the desired width and the desired intensity of illumination on the surface of illumination such as a document surface and 2 if the position of the light emitting diode 52 is shifted in a direction meeting at a right angle with a central axis of the columnar lens 54 (hereinafter referred to as side shifting), the beam is greatly dislocated, whereby the linearity of the incident ray on the surface of illumination is lost. Accordingly, provided that for example the distance between the top surface of the rod lens made of glass having a diameter of 5 mm and the light emitting diodes is 6 mm and the distance between the lens surface and the surface of illumination is 6 mm, the width of illumination ought to amount to 1.5 mm. But even though the light emitting diodes are arranged in line at a severity of the permissible limit of side shifting from the center of the line of ±50 μm, actually an effective width of illumination of only about 1.2 mm can be obtained. In addition, in general, it is required that the width of illumination be as wide as possible to an extent of 1.0 to 3.0 mm for making the installation of the linear light source and the reading elements easy, but if the width of illumination of the above described columnar lens is increased, the intensity of illumination is reduced and also the side shifting of the light emitting diodes leads to the partial reduction of intensity of illumination (uneven intensity of illumination) on the defined surface of illumination.

SUMMARY OF THE INVENTION

The present invention has been achieved for solving the above described points of problem and uses a resin molded rod lens of a linear light source provided with at least one projection to be engaged with an engaging member formed in a side wall of a frame member, and a wing member to be in contact with a top portion of the side wall of the frame member on both side surfaces thereof.

In addition, the linear light source according to the present invention uses a rod lens comprising a lens surface covering all of the width of opening of the frame member and a flat surface or a curved lower surface having a radius sufficiently larger than that of a lens surface.

It is a first object of the present invention to provide a linear light source capable of changing a curvature of a rod lens.

It is another object of the present invention to provide a linear light source having an excellent adhesion of the rod lens to a frame member and capable of always maintaining its optical positional relation relative to a surface of illumination constant.

It is a further object of the present invention to provide a linear light source capable of increasing the transparency of the rod lens and maintaining desired optical characteristics for a long time by forming a treated portion after pouring resin at a central portion of the rod lens, in the same line as the engaging projection and the wing member.

Still another object of the present invention is to provide a linear light source capable of giving a light-diffusing effect and a light-collecting effect to the rod lens to increase a width of illumination.

It is a further object of the present invention to provide a linear light source capable of increasing a permissible limit of side shifting of light emitting diodes.

It is an additional object of the present invention to provide a linear light source capable of obtaining an almost M letter-like distribution of brightness on a surface meeting at right angles with a longitudinal direction of the rod lens to increase the width of illumination by positioning a curvature center of the lens surface nearly ¼ of a distance from the light emitting diodes to the surface of illumination.

It is another object of the present invention to provide a linear light source which is easy to be installed on the respective apparatus and match in optical axis by increasing the width of illumination.

It is a further object of the present invention to provide a linear light source which is easy to match in optical axis and be handy by guiding a light from the light emitting diodes closer to a photo-sensitive element by means of the rod lens and fixedly arranging the light emitting diodes and the photo-sensitive element on the same one flat surface.

The above and further objects and features of the invention will more fully be apparent from the following detailed description with accompanying drawings.

DESCRIPTION OF THE PREFERRED EMBODIMENTS

The preferred embodiments of the present invention will be below concretely described.

Figure 2:
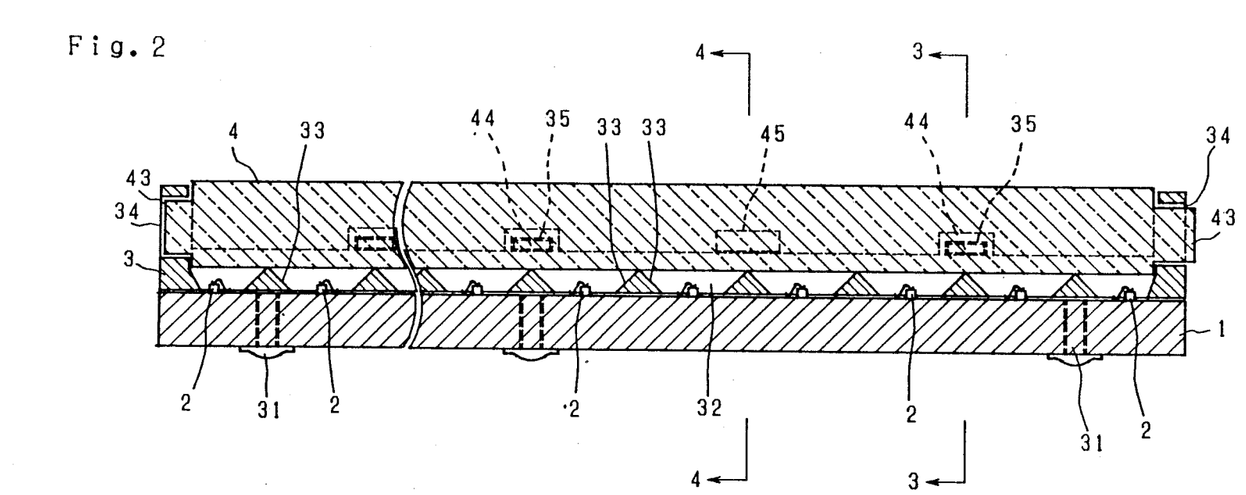
FIG. 2 is a longitudinal sectional view showing a linear light source according to the present invention.
Figure 3:
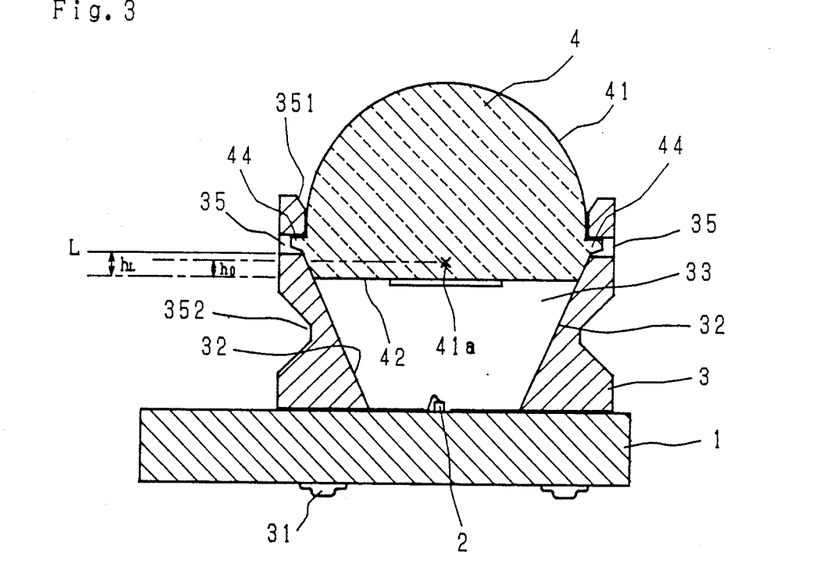
FIGS. 3 and 4 are cross sectional views along lines 3—3 and 4—4 of FIG. 2 showing a linear light source according to the present invention.
Figure 4:
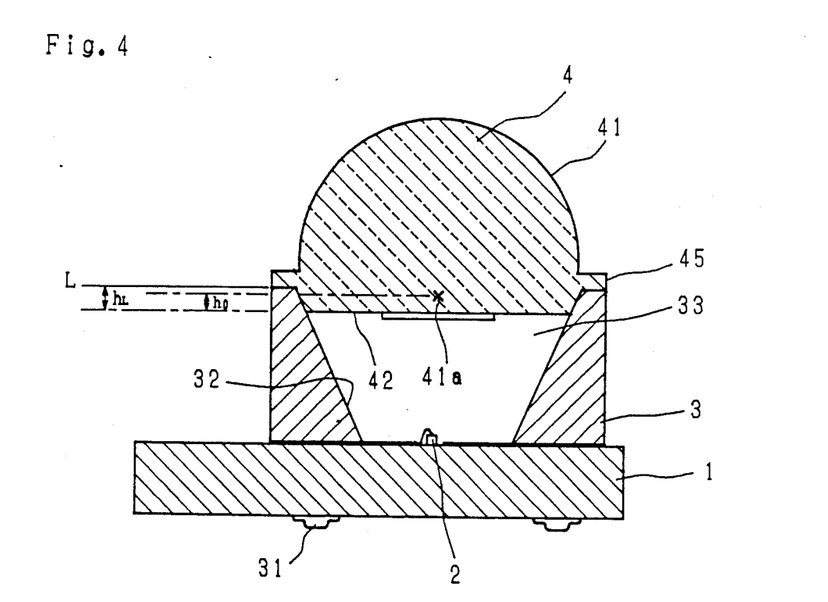
Figure 5:
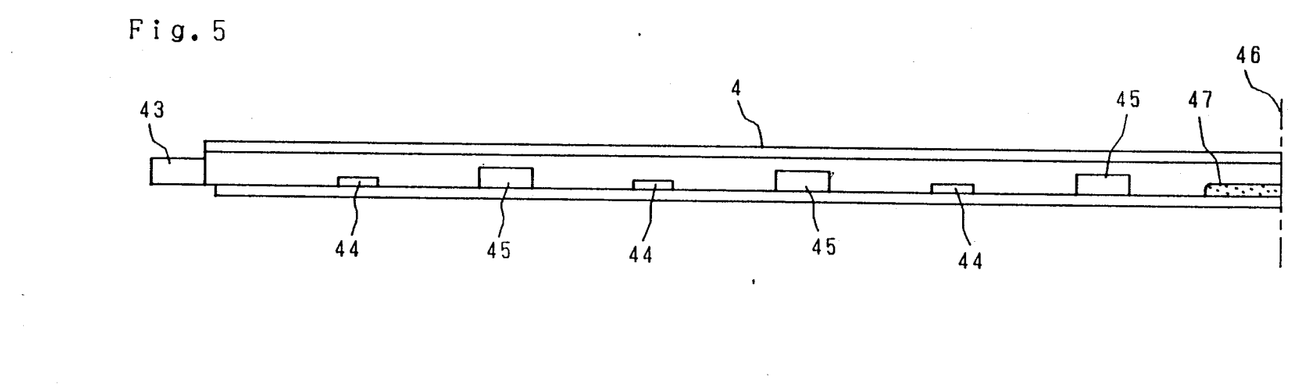
FIG. 5 is a side view showing a rod lens used in a linear light source according to the present invention.

FIG. 2 is a longitudinal sectional view showing a linear light source according to the present invention, FIGS. 3 and 4 being cross sectional views and FIG. 5 being a side view showing a rod lens used in the linear light source according to the present invention. Referring now to FIGS. 2 to 5, reference numeral 1 designates a long substrate, such as a glass-epoxy resin substrate having in the illustrative embodiment being described, a width of 6 mm and a length of 350 mm, with a printed circuit (not shown) on a right side or both the right side and a back side thereof, preferably with a light-reflecting white paint applied on the uppermost layer of the right side excepting a wiring region. Reference numeral 2 designates a plurality of light emitting diodes fixedly mounted on the substrate 1 in the line and wired, the light emitting diodes 2 being formed of GaP, GaAsP and the like having almost a dice-like shape and sides of about 0.2 to 0.4 mm and arranged at intervals of about 2 to 10 mm.

Reference numeral 3 designates a frame member fixedly mounted on the substrate 1 by any suitable means such as pins 31 welded thereto at pointed ends, sheet adhesives (not shown) and the like. Each light emitting diode 2 is surrounded by light-reflecting side walls 32 provided along a line of the light emitting diodes 2 and relatively low partition reflecting surfaces 33 for partitioning every one or several light emitting diodes 2 to form a reflecting frame. Each reflecting surface 33 extends across the width of the lens and is of generally triangular shape, the apex of the triangle being wider than the base (See FIGS. 3 and 4). The frame member 3 is provided with holes 34 for fixing a rod lens at both ends and engaging members 35, consisting of a long and slender hole or recess formed on an inside of the side walls 32, 32 thereof.

Reference numeral 4 designates a rod lens fixedly mounted on the frame member 3 so as to be positioned above the light emitting diodes 2. The rod lens 4 is formed of a resin molded product such as acrylic resin and the like. The rod lens 4 has a lens surface 41 (See FIGS. 3 and 4) formed of a curved surface having a single radius and covering the width of an opening of the frame member 3 formed in an upper portion thereof. The lower rod surface 42 is formed of a flat surface or a curved surface having a sufficiently large radius in comparison with that of the upper lens surface 41 and is in contact with top portions (apex) of the partition reflecting surfaces 33. In addition, each end of the rod lens 4 is formed with an end projection 43, inserted into the mounting holes 34, 34 in the frame 3 so that a direction of a crest line of the rod lens 4 may be parallel in the direction in which the light emitting diodes 2 are in line. In order to prevent the rod lens 4 from being bent and side shifted, it is preferable that the shape of the end projection 43 is different from that of a central portion of the rod lens 4.

The rod lens 4 is provided with a plurality of spaced ribs 44 which are to be snapped into engaging recesses 35. The rod also has outwardly extending wing members 45 in contact with portions of the top of side walls 32, 32 of the frame member 3. The ribs 44 and wing members 45 are alternately disposed at regular intervals on both side surfaces of the rod 4 and are arranged so that the lower surfaces thereof lie on one straight line.

In order to fix the rod lens 4 within the frame member 3, the flexibility of both the rod lens 4 and the frame member 3 is utilized. That is, it is necessary only to put one end or both ends 43 of the rod lens 4 in the mounting holes 34. To this end, it is preferably that the upper part of the frame 3 above the recesses 35 be provided with an inclined inner wall portion 351 to more easily force the respective engaging ribs 44 in the recesses 35. The side walls 32 of frame 3 in which the respective recesses 35 are located are partially provided with a depression 352 formed in a lower side on an outer surface thereof to give an elasticity to the respective side walls 32.

In addition (See FIG. 5), the rod lens 4 is provided with a treated portion 47, where burrs resulting from the formation of a resin-pouring gate in a mold formed during the molding of resin have been treated. This is in the vicinity of a central section 46 on one side of the rod on the lower surface thereof which coincides with the position of the lower surfaces of the engaging ribs 44 and the wing member 45. This section is not provided with the engaging rib 44 and the wing member 45 (refer to FIG. 5). The rod lens 4, which is not cloudy or bubbled and does not show the trace of the flow of resin, can be produced with a good productivity factor by providing the resin-pouring gate in a flat manner in this section of limited area.

A preferred embodiment of the rod lens 4 has a length of 350 mm, a thickness of 2.5 mm and a width of 3.0 mm and comprises an arched portion having a radius of curvature of the lens surface 41 of 2.0 mm. In addition, both the engaging ribs 44 having a height of 0.3 mm, a length of 2.5 mm and a projecting distance of 0.25 mm and the wing members 45 have a height of 0.7 mm, a length of 4.0 mm and a projecting distance of 1.0 mm. The ribs 44 and wings 45 are alternately disposed at intervals of 20 mm. Sixteen engaging ribs 44 and fifteen wing members 45 are disposed on one side and fourteen engaging ribs 44 and fourteen wing members 45 are disposed on the other side of the rod. In addition, the treated portion 47 has a height of 0.5 mm and a length of 20 mm. Besides, here the height is a height from a base line L (refer to FIGS. 3 and 4). The base line L is positioned at top portions of the side walls 32, 32 of the frame member 3.

Here, in order to leave no trace of the flow of resin after molding, it is preferable that the resin-pouring gate is disposed on a side surface of the rod lens 4 at a position slightly lower than that of a center of thickness. Concretely speaking, at first the lower surface 42 is disposed at a position shorter than ½ times the radius of curvature of the lens surface 41. And, a height ($h_L$) from the lower surface 42 to the base line L is set so as to be equal to a height ($h_0$) from the lower surface 42 to a center 41a or slightly higher than the height ($h_0$) and the resin-pouring gate is disposed in accordance with the base line L. In the above described preferred embodiment the height ($h_L$) is higher than a height of the center 41a by 0.1 mm. In addition, it is preferable that the molded resin is subjected to an optical mirror-finishing and a surface treatment such as antistatic coating treatment.

Next, the movement of the beam and the distribution of brightness in the linear light source according to the present invention will be described.

Figure 6:
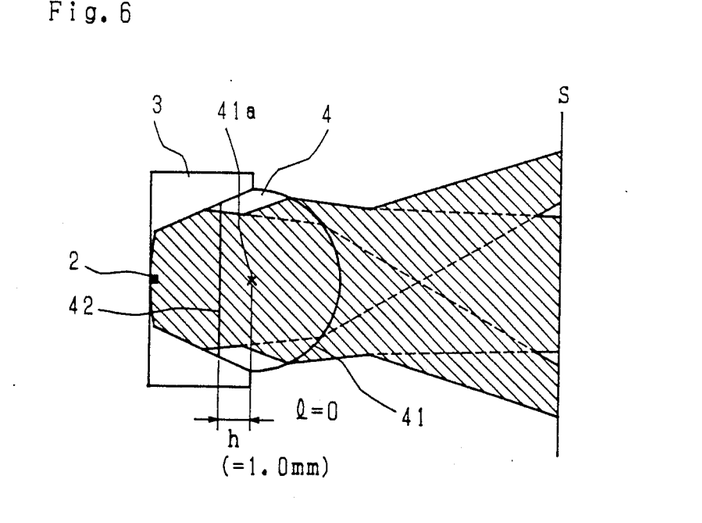
FIG. 6 is a diagram showing a beam from a linear light source according to the present invention.

In such the formation of a light beam progresses in the manner shown by oblique lines in FIG. 6. The light-reflecting side walls 32, 32 serves to confine the light in the frame member 3 similarly to the conventional construction. The side walls 32, 32 do not orientate the light to the surface of illumination in themselves, that is, they do not have a great inclination, for example an angle of inclination of 45° or less. In the case where it is desired to sufficiently reduce the width of the lens, they may meet at right angles with the surface of the substrate. The construction is selected so that the light-diffusing effect may be brought about below the rod lens 4. That is to say, the upward light is efficiently distributed over a wide range by selecting the height and the condition of the lower surface 42 of the rod so that the light may be efficiently incident upon the lower surface 42 from many directions, taking a refractive index and the thickness of the rod lens 4 into consideration, and selecting the parameters so that a course of the light may be extended in a lower layer portion of the rod lens 4 with a reduced optical absorption. This condition of the light leads to the possibility of visually confirming the diffusion or the collection of light, since the places where the beam is strong are brightly seen. If for example the resin boundary surface (thin layer of air) is arranged at a desired position within the rod lens 4 and the diffusion or collection of light can be made by computer simulation to plot the places of the appointed brightness.

The light beam, which has been formed in the above described manner, it guided to the surface of illumination by the upper lens surface 41. The light is adapted so that a portion thereof having an increased optical intensity brightness is directed to both sides (vicinities of long sides of a linear illumination range) of the desired portion of the surface of illumination. That is, the width of the beam is made wide. Thus, the intensity of illumination is increased, whereby not only the position of a document can be easily confirmed but also misreading by the photo-sensitive elements can be reduced. In addition, since the width extended beam is guided, it is preferable for increasing the efficiency to cover all the width of opening of the frame member 3 with the lens surface 41.

Figure 7:
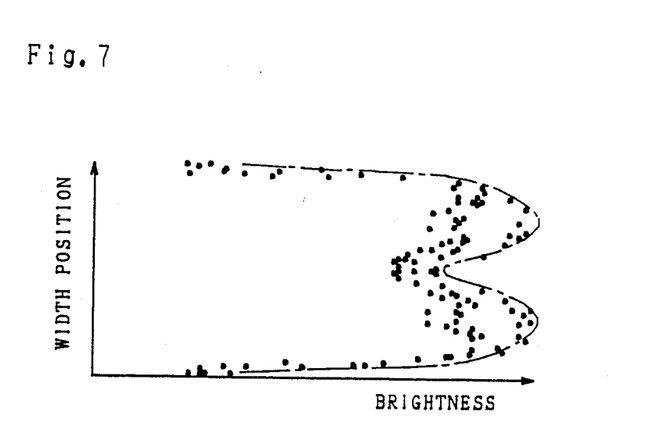
FIG. 7 is a diagram showing a distribution of brightness of a linear light source shown in FIG. 6.

The distribution of brightness under the condition shown in FIG. 6, that is, the distribution of brightness in a surface S meeting at right angles with a longitudinal direction of the rod lens 4, is shown in FIG. 7. The distribution of brightness is almost M letter-like.

The distribution of brightness and the effective width of illumination in the surface meeting at right angles with the longitudinal direction of the rod lens 4, when the height of the base line L (height from the light emitting diodes 2 to the base line L) is set at 3.0 mm, an irradiating distance being set at 6.0 mm from the top of the lens surface 41, the refractive index of the rod lens 4 being 1.490, for varying the radius r of the lens surface 41, the height l of the center 41a of the curvature of the lens surface 41 and the height h of the lower surface 42 are shown in the following Table. In addition, both l and h are the height from the base line L and expressed with a side facing to the light emitting diodes 2 as + and a side facing to the surface of illumination as −.

TABLE

| | Example | | | Conventional Example | | |
| --- | --- | --- | --- | --- | --- | --- |
| | Lot No. | | | | | |
| | (a) | (b) | (c) | (d) | (e) | (f) |
| Radius r and Height l of the Lens Surface 41 | 2.5 mm | 2.5 | 2.5 | 2.5 | 2.5 | 4.2 |
| | 0.0 mm | 0.0 | 0.5 | 0.0 | 0.5 | 2.0 |
| Height h of the Lower Surface 42 | 1.0 mm | 0.0 | 0.0 | −1.0 | −1.0 | 0.6 |
| Distribution of Brightness in a Section | M Letter-Like | | | Inverse U Letter-Like | | |
| Effective Width of Illumination | 2.5 mm | 2.2 | 2.7 | 1.0 | 1.5 | 0.5 |

Figure 8:
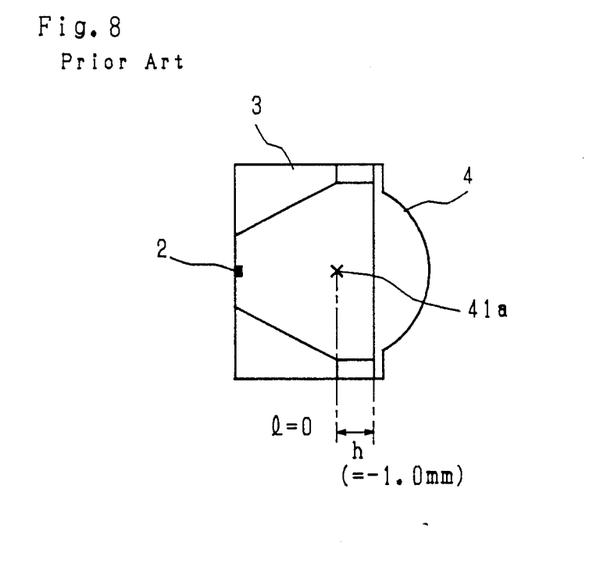
FIG. 8 is a schematic diagram showing the conventional linear light source.
Figure 9:
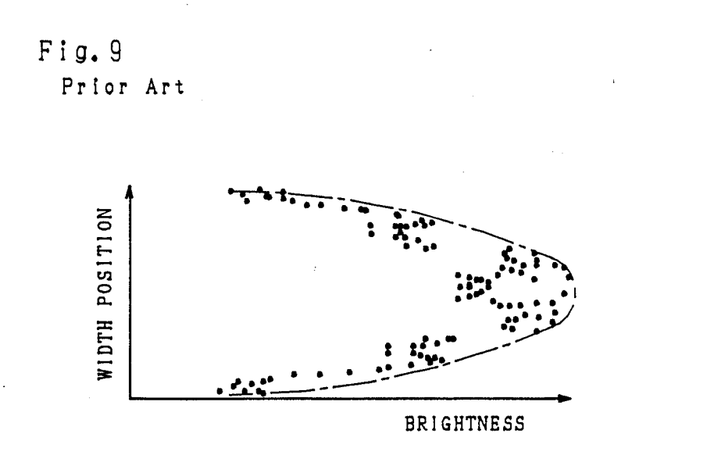
FIG. 9 is a diagram showing a distribution of brightness of the linear light source shown in FIG. 8.

The FIGS. 6, 7 correspond to the example (a) in the above described Table. In addition, FIGS. 8, 9 are a schematic diagram and a diagram showing the distribution of brightness in example (d) disclosed in Japanese Patent Application Laid-Open No. 60-147177 (1985). In the conventional examples the distribution of brightness is inverse U letter-like and the strong beam is orientated toward the central portion of the surface of illumination, which is disadvantageous for the expansion of the width of the beam of illumination.

As above described, it is one condition for increasing the intensity of illumination and making the illumination beam having an increased width that in order to effectively guide the beam below the lens member, the lower surface is formed of an almost flat surface. That is, a flat surface or a curved surface having a radius sufficiently larger, for example 5 times or more than that of the upper lens surface, and this lower surface is arranged below the upper lens surface.

In addition, it is a condition on the basis of another investigation that the beam having an increased intensity of light is orientated toward the vicinity of long sides of the effective irradiating range of the surface of illumination. That is, the distribution of brightness in the surface meeting at right angles with the longitudinal direction of the rod lens 4 is almost M letter-like. It is one method for achieving it that an almost flat lower surface 42 is arranged below the lens upper surface 41 and the center 41a (See FIG. 6) of the curvature of the lens surface 41 is positioned at the vicinity of a point almost $\frac{1}{4}$ surface S of illumination. In this case, it is preferable to use a rod lens made of resin having a refractive index of about 1.49 and a good adhesion to the frame member 3, rather than glass, of which refractive index is varied in a range from 1.40 to 1.90 by the addition of additives to the resin.

It is the reason of this that since the light emitting diodes 2 are heated when lighted, it is preferable that the optical arrangement is not changed by a temperature-change and it is not changed also by a vibration and the like. To this end, it is preferable that the optical arrangement is defined by the thickness and shape of the rod lens 4 and an adhesion to the frame member 3 or the substrate 1 is increased rather than that the optical arrangement is defined by the refractive index and the frame member 3 and the substrate 1 is corrected relatively to hard glass. And, in particular, if the almost flat lower surface 42 and the portion having the appointed thickness exist, as in the above described preferred embodiment, the adhesion is remarkably improved.

In addition, it leads to an increase of the permissible limit of the side shifting for the light emitting diodes 2 if the lower surface 42 is almost flat. For example, in the case of the above described Example (a), the permissible limit of side shifting for the light emitting diodes 2 from the center of their line amounts to ±100 μm, which is 2 times as large as that in the columnar lens.

The upper lens surface 41 may be formed of a plurality of curved surfaces or a parabolic surface but it is preferable that it is formed of an arc having a single radius in view of the molding of resin.

Figure 10:
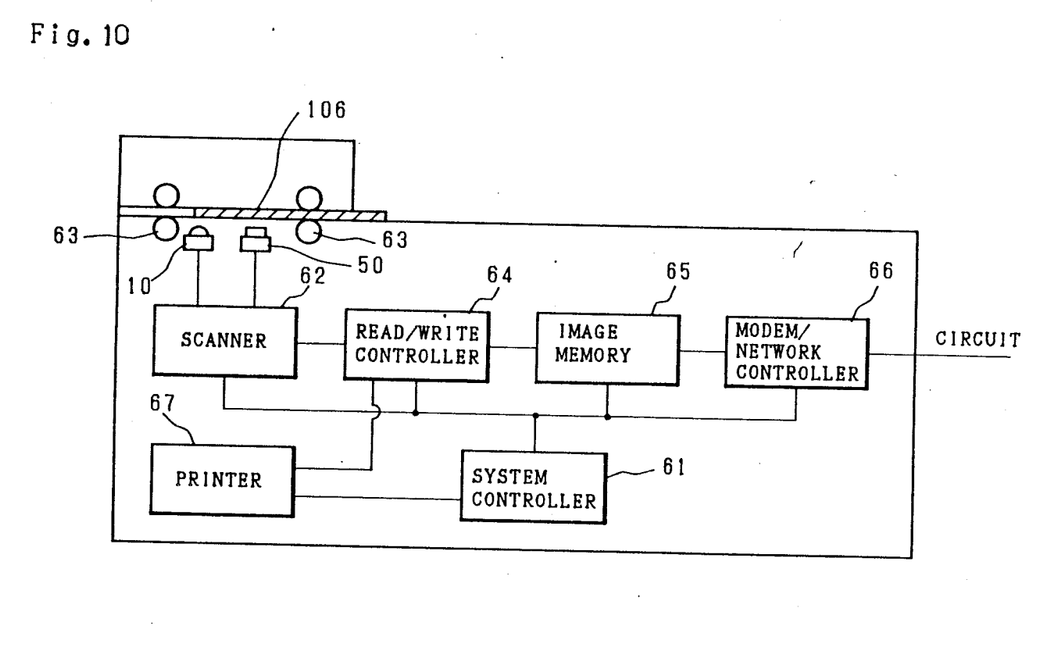
FIG. 10 is a schematic diagram showing a construction of a facsimile using the linear light source according to the present invention.

Now then, the surface of illumination can be dislocated from the position just above the light emitting diode 2. FIG. 10 shows its one example. A linear light source comprising two lines of light emitting diodes 102 are arranged on one flat surface of a substrate 101. An array of photosensitive elements 105, such as linear amorphous silicon array, is disposed at a central portion between the two lines of the light emitting diodes 102 so that the three lines are parallel to each other as is illustrated. Rod lenses 104, 104 are formed of long acrylic resin materials similarly to those in the preferred embodiment. A light-collecting range is gradually changed from one side (inner side) toward the other side (outer side) and the lower lens surfaces 1041, are more exposed and opened toward the inner side of the center line of the elements 105. Thus, the lights from the two lines of the light emitting diodes 102 are incident upon the surface of illumination of a document 106 with widths of illumination A, B closer to the array of photo-sensitive elements so that an increased intensity of illumination range on one side may be positioned almost just above the array of the photo-sensitive elements 105.

Next, an apparatus utilizing the linear light source according to the present invention is below described with reference to a facsimile machine. FIG. 10 is a block diagram showing a construction of this facsimile. Referring to FIG. 10, reference numeral 10 designates the linear light source according to the present invention, reference numeral 50 designating a linear photo-sensitive element. When a document 106 is inserted, a driving signal is put out from a system controller 61 to a scanner 62. Document-feeding rollers 63, 63 are rotated in synchronization with the driving signal to light all light emitting diodes (not shown) of the linear light source 10. And, a binary signal, which is obtained by dividing the output signal from the photo-sensitive element 50 into binary values, is subjected to a rectification in wave form and then put out to a Read/Write controller 64 as an image signal. The put-out image signal is turned into a mark in the Read/Write controller 64 to be transmitted to a telephone circuit through an image memory 65 and a modem/network controller 66. In addition, reference numeral 67 designates a printer for printing the received marked image signal on a paper.

In addition, although the case where the linear light source according to the present invention is used in a facsimile is described in this preferred embodiment, it goes without saying that the linear light source according to the present invention may be used in other optical reading apparatus such as copying machine.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A linear light source, comprising:
   a substrate,
   a plurality of light emitting diodes placed on said substrate in line,
   a frame member provided with side walls along said line of a plurality of light emitting diodes and mounted on said substrate, said side walls having top portions which face away from said substrate and which are further from said substrate than are other portions of said side walls that are between said top portions and said substrate, and
   a rod lens made of resin having a crest line parallel to said line of said plurality of light emitting diodes, said rod lens being mounted on said frame member so as to be positioned opposite to said light emitting diodes, said rod lens and said side walls having a plurality of interengaging members which are interengaged with each other, said rod lens also having a plurality of wing members in contact with the top portions of the side walls of said frame member, said rod lens having a surface facing said substrate, said wing members including a pair of wing members extending outward in opposite directions from each other and away from said surface so that said top portions are between said wing members and said substrate and free of being between said surface and said substrate.

2. A linear light source as set forth in claim 1, wherein said rod lens is elongated so as to have side surfaces in a direction of elongation of said rod lens, said interengaging members of said rod lens and said wing members being alternately arranged on both of said side surfaces of said rod lens.

3. A linear light source as set forth in claim 1, wherein said rod lens comprises a lens surface covering all of a width of opening of said frame member and a counter surface formed of a flat surface positioned opposite to said lens surface so that a distribution of brightness in a surface meeting at right angles with a longitudinal direction of said rod lens is M letter-like.

4. A linear light source as set forth in claim 1, wherein said rod lens comprises a lens surface covering all of a width of opening of said frame member and a counter surface formed of a flat surface positioned opposite to said lens surface, a center of curvature of said lens surface being positioned in said rod lens.

5. A linear light source as set forth in claim 3, wherein said lens surface is an arc having a single radius.

6. A linear light source as set forth in claim 3, wherein a center of curvature of said lens surface is positioned less than ¼ of a distance from said light emitting diodes to a surface of illumination.

7. A linear light source as set forth in claim 1, wherein said rod lens comprises a lens surface covering all of a width of opening of said frame member and a counter surface formed of a curved surface having a radius larger than that of said lens surface positioned opposite to said lens surface, a center of curvature of said lens surface being positioned in said rod lens.

8. A linear light source as set forth in claim 1, wherein a central portion of one side of said rod lens is composed of resin.

9. A linear light source as set forth in claim 2, wherein a central portion on one side of said rod lens and lying even with said wing members is a composed of resin.

10. A linear light source as set forth in claim 3, wherein a central portion on one side of said rod lens is composed of resin.

11. A linear light source as set forth in claim 1, wherein said rod lens is made of acrylic resin.

12. A linaer light source as set forth in claim 1, wherein said rod lens has end portions each with projections, said projections being fixedly inserted into holes formed in said frame member.

13. A reading device, comprising:
a substrate,
a plurality of light emitting diodes placed on said substrate in line for applying a light to a document,
a frame member provided with side walls along said line of plurality of light emitting diodes and mounted on said substrate, said side walls having top portions which face away from said substrate and which are further from said substrate than are other portions of said side walls that are between said top portions and said substrate, and
a rod lens made of resin having a crest line parallel to said line of a plurality of light emitting diodes, said rod lens being mounted on said frame member so as to be positioned opposite to said light emitting diodes, said rod lens and said side walls having a plurality of interengaging members which are interengaged with each other, said rod lens also having a plurality of wing members in contact with the top portions of the side walls of said frame member, said rod lens having a surface facing said substrate, said wing members including a pair of wing members extending outward in opposite directions from each other and away from said surface so that said top portions are between said wing members and said substrate and free of being between said surface and said substrate.

14. A linear light source, comprising:
a substrate,
a plurality of light emitting diodes placed on said substrate in line,
a frame member surrounding said plurality of light emitting diodes and mounted on said substrate, and
a rod lens having a crest line parallel to said line of a plurality of light emitting diodes, said rod lens being mounted on said frame member so as to be positioned opposite to said light emitting diodes, said rod lens having a lens surface covering all of a width of an opening of said frame member and a counter surface formed of a curved surface having a radius larger than that of said lens surface, said lens surface having a center of curvature which is positioned in said rod lens, said rod lens being elongated and having a surface facing said substrate and having pairs of wing members, said wing members of each pair of wing members extending outward away from said surface in opposite directions, said wing members being arranged in a straight line along a direction of elongation of said rod lens, said wing members being in contact with top portions of said frame member.

15. A linear light source as set forth in claim 1, wherein siad side walls have means for providing elasticity to said side walls where said interengaging members are located.

16. A linear light source as set forth in claim 15, wherein said side walls have a depression which gives rise to said elasticity.

17. A linear light source as set forth in claim 1, wherein said interengaging members of said rod lens are projections which extend outward in the same direction as does said wing members.

18. A linear light source as set forth in claim 13, wherein said interengaging members of said rod lens are projections which extend outward in the same direction as does said wing members.

19. A linear light source as set forth in claim 2, wherein said interengaging members and said wing members are arranged along a straight line.

* * * * *